US006194733B1

(12) United States Patent
Haas et al.

(10) Patent No.: US 6,194,733 B1
(45) Date of Patent: Feb. 27, 2001

(54) METHOD AND APPARATUS FOR ADJUSTABLY SUPPORTING A LIGHT SOURCE FOR USE IN PHOTOLITHOGRAPHY

(75) Inventors: Edwin G. Haas, Sayville; Vincent A. Christina, Shoreham, both of NY (US); Richard A. Hartley, Jr., Burlington Township, NJ (US); Bruce D. Abel, Sayville, NY (US); Alan M. M. Todd, Princeton Junction, NJ (US)

(73) Assignee: Advanced Energy Systems, Inc., Bethpage, NY (US)

( * ) Notice: Subject to any disclaimer, the term of this patent is extended or adjusted under 35 U.S.C. 154(b) by 0 days.

(21) Appl. No.: 09/054,977

(22) Filed: Apr. 3, 1998

(51) Int. Cl.[7] .................................................. H01J 35/26
(52) U.S. Cl. ........................................................ 250/492.2
(58) Field of Search ........................... 250/492.2, 493.1, 250/504 R; 372/22; 313/231.31, 231.61, 231.71

(56) References Cited

U.S. PATENT DOCUMENTS

| | | | |
|---|---|---|---|
| 3,156,950 | 11/1964 | Walton, Jr. ................................. 18/8 |
| 3,686,528 | 8/1972 | Sheets ..................................... 315/111 |
| 3,709,434 | 1/1973 | Gebhardt et al. ........................ 239/8 |
| 3,876,149 | 4/1975 | Futerko ................................... 239/398 |
| 3,972,474 | 8/1976 | Keur ........................................ 239/102 |
| 4,161,280 | 7/1979 | Kasinskas ............................... 239/1 |
| 4,178,078 | 12/1979 | Hausmann ............................. 350/319 |
| 4,184,078 | 1/1980 | Nagel et al. ............................ 250/492.2 |
| 4,408,338 | 10/1983 | Grobman ................................ 378/34 |
| 4,455,470 | 6/1984 | Klein et al. ............................. 219/121 |
| 4,549,082 | 10/1985 | McMillan ................................ 250/423 |
| 4,560,880 | 12/1985 | Petric et al. ............................. 250/441.1 |
| 4,577,122 | 3/1986 | Kung ....................................... 307/425 |
| 4,584,479 | 4/1986 | Lamattina et al. ..................... 250/441.1 |
| 4,607,167 | 8/1986 | Petric .................................... 250/492.2 |
| 4,692,934 | 9/1987 | Forsyth .................................. 378/34 |
| 4,730,784 | 3/1988 | Boch et al. ............................. 239/416.4 |

(List continued on next page.)

FOREIGN PATENT DOCUMENTS

| | | |
|---|---|---|
| 0 858 249 | 8/1998 | (EP) . |
| 2 195 070 | 3/1988 | (GB) . |
| 95 25370 | 9/1995 | (WO) . |
| 98 34234 | 8/1998 | (WO) . |

OTHER PUBLICATIONS

Cluster Formation In Expanding Supersonic Jets: Effect Of Pressure, Temperature, Nozzle Size, And Test Gas, O.F. Hagena and W. Obert, The Journal Of Chemical Physics, vol. 56, No. 5, Mar. 1, 1972, 1793–1802.
Cluster Ion Sources (Invited), Otto F. Hagena, Rev. Sci. Instrum., vol. 63, No. 4, Apr. 1992, 2374–2379.
Density Measurements Of A Pulsed Supersonic Gas Jet Using Nuclear Scattering, J.G. Pronco, D. Kohler, I.V. Chapman, T.T. Bardin, P.C. Filbert, and J.D. Hawley, Rev. Sci. Instrum., vol. 64, No. 7, Jul. 1993, 1744–1747.
Electron–Gun–Driven EUV Lithography System, OSA Proceeding on Extreme Ultraviolet Lithography, vol. 23, Alan M. Todd, Ira S. Lehrman, Jayaram Krishnaswamy, Vincent Calia, and Robert Gutowski, 1994, pp. 274–277.

Primary Examiner—Kiet T. Nguyen
(74) Attorney, Agent, or Firm—Baker Botts L.L.P.

(57) ABSTRACT

A method and apparatus for producing extreme ultra-violet light comprising a nozzle for flowing a gas at a supersonic velocity, a source for directing a radiated energy beam into the flowing gas to stimulate emission of extreme ultra-violet light therefrom, and optionally a diffuser for capturing a substantial portion of the gas so that the gas may be recycled in a closed-loop system. The extreme ultra-violet light so produced is suitable for use in photolithography for integrated circuit fabrication and the like. A remotely-controlled XYZ micro-positioning stage facilitates alignment of the nozzle and the diffuser to the radiated energy beam.

16 Claims, 8 Drawing Sheets

U.S. PATENT DOCUMENTS

| | | | |
|---|---|---|---|
| 4,820,927 | 4/1989 | Langner et al. | 250/492.2 |
| 4,830,280 | 5/1989 | Yankoff | 239/11 |
| 4,954,715 | 9/1990 | Zold | 250/461.1 |
| 4,980,563 | 12/1990 | George et al. | 250/492.2 |
| 4,982,067 | 1/1991 | Marantz et al. | 219/121.47 |
| 4,990,789 | 2/1991 | Uesaki | 250/504 |
| 5,012,105 | 4/1991 | Ando et al. | 250/398 |
| 5,012,853 | 5/1991 | Bihlmaier | 164/75 |
| 5,103,102 | 4/1992 | Economou et al. | 250/492.2 |
| 5,175,929 | 1/1993 | Anthony et al. | 29/890.142 |
| 5,185,552 | 2/1993 | Suzuki et al. | 313/231.71 |
| 5,204,506 | 4/1993 | Asmus et al. | 219/121.37 |
| 5,214,290 | 5/1993 | Sakai | 250/492.2 |
| 5,298,835 | 3/1994 | Muehlberger et al. | 315/111.21 |
| 5,376,791 | 12/1994 | Swanson et al. | 250/309 |
| 5,499,282 | 3/1996 | Silfvast | 378/119 |
| 5,577,092 | 11/1996 | Kublak et al. | 378/119 |
| 5,591,970 * | 1/1997 | Komano et al. | 250/492.21 |
| 5,637,962 | 6/1997 | Prono et al. | 315/111.21 |
| 5,643,801 | 7/1997 | Ishihara et al. | 437/7 |
| 5,644,137 | 7/1997 | Waggener et al. | 250/492.2 |

* cited by examiner

METHOD AND APPARATUS FOR ADJUSTABLY SUPPORTING A LIGHT SOURCE FOR USE IN PHOTOLITHOGRAPHY

RELATED APPLICATIONS

This application is related to the following pending patent applications: Method and Apparatus for Producing Extreme Ultra-violet Light for Use in Photolithography, filed Feb. 4, 1997, Ser. No. 08/794,802; Emitted Energy System for Photolithography, filed Apr. 3, 1998, Ser. No. 09/055,024; Precision Nozzle/Diffuser Holder System and Method in an Emitted Energy System for Photolithography, filed Apr. 3, 1998, Ser. No. 09/055,035; Method of Manufacturing Very Small Diameter Deep Passages, filed Apr. 3, 1998, Ser. No. 09/054,987; Fluid Nozzle System and Method in an Emitted Energy System for Photolithography, filed Apr. 3, 1998, Ser. No. 09/054,831; and Diffuser System and Method in an Emitted Energy System for Photolithography, filed Apr. 3, 1998, Ser. No. 09/055,034.

FIELD OF THE INVENTION

The present invention relates generally to photolithographic techniques and apparatus, for use in the fabrication of semi-conductor components. The present invention relates more particularly to a method and apparatus for adjustably supporting a light source for producing extreme ultra-violet light for use in a photolithography system which facilitates the production of semi-conductor components having minimum feature sizes on the order of 100 nm and smaller.

BACKGROUND OF THE INVENTION

The use of photolithographic techniques in the fabrication of semi-conductor components such as dynamic RAM chips (DRAM), is well known. In the practice of such photolithographic techniques, light is utilized to cure or harden a photomask which prevents the chemical etching of various semi-conductor, conductor, and insulator portions of the device, as desired.

As those skilled in the art will appreciate, the trend is toward semi-conductor components having greater and greater densities. This is particularly true in the area of microprocessors, wherein it is extremely desirable to provide as much processing capability as possible in a given package.

As those skilled in the art will appreciate, it is necessary to decrease the line size or geometry of the various semi-conductor, conductor, and insulator lines formed upon the component substrate in order to facilitate such increased density. That is, by making the individual devices, i.e., transistors, diodes, etc., formed upon the integrated circuit chip smaller, a larger number of such devices may be formed thereon. This, of course, facilitates fabrication of DRAM chips having greater capacity, for example.

However, when utilizing photolithographic techniques, the lower limit on the line size is defined by the wavelength of the light utilized in the photolithographic process. Thus, extreme ultra-violet light (EUV) is capable of forming smaller line sizes (resulting in greater packaging densities) than is ultra-violet or visible light. Because of this, it is highly desirable to utilize extreme ultra-violet light in the photolithographic processes associated with the fabrication of integrated circuit components.

According to contemporary methodology, two important goals associated with the use of extreme ultra-violet light in such photolithographic processes tend to be mutually exclusive. As those skilled in the art will appreciate, it is desirable to provide an intense source of extreme ultra-violet light and it is also desirable to minimize the generation of debris during the generation of such light.

The curing time is directly proportional to the intensity of the light source. Thus, it is desirable to have an intense light source such that mask curing time may be reduced and the production rate correspondingly increased.

It is desirable to minimize the generation of debris since such debris undesirably absorbs the extreme ultra-violet radiation prior to its being utilized in the curing process. Such debris also undesirably contaminates and degrades the performance of the optics which are utilized to collect and focus the extreme ultra-violet light. It also increases the filtering load on the system.

The generation of such debris is inherent to contemporary methodologies for producing extreme ultra-violet light and tends to increase as an attempt is made to increase the intensity of the extreme ultra-violet light.

According to one exemplary contemporary methodology for generating extreme ultra-violet light, a radiated energy beam such as the output of a high energy laser is directed onto a solid target. Various different solid targets have been utilized. For example, it is known to form such targets of tungsten, tin, copper, and gold, as well as solid xenon.

The low reflectivity of mirrors which are suitable for use at the desired extreme ultra-violet light wavelength inherently reduces the transmission of extreme ultra-violet light through the optical system and thus further necessitates the use of a high intensity extreme ultra-violet light source. Degradation of the mirrors and other optical components by contamination due to debris formed during the extreme ultra-violet light generation is thus highly undesirable. Of course, as the intensity of the extreme ultra-violet light generation process is increased (by increasing the intensity of the radiated energy beam directed onto the target), more debris are formed. Thus, when utilizing such solid target configurations, the goals of debris reduction and intensity enhancement tend to be mutually exclusive.

Consequently, the use of lasers and/or electron beams to ionize a gas flow so as to emit the desired intensity of extreme ultra-violet light while mitigating the production of undesirable debris is presently being investigated. Thus, it is known to utilize gas jets for the targets of lasers and electron beams in the production of extreme ultra-violet light. It is also known to cryogenically cool noble gases such as xenon and argon, so as to cause the gas to assume a super cooled state, wherein the individual atoms are drawn together into large clusters of several thousand atoms or more.

The light source for such a photolithographic system, according to the present invention, comprises a nozzle/diffuser assembly which is disposed in a vacuum chamber and which must be precisely aligned with respect to a laser or electron source in order to maximize the efficiency thereof. As those skilled in the art will appreciate, the removal and replacement of the nozzle/diffuser assembly, as occurs during maintenance, necessitates the realignment thereof with respect to the laser or electron beam. Such realignment is difficult and time consuming, since the nozzle/diffuser is disposed within the vacuum chamber and access thereto is severely limited during operation thereof (which is when adjustment thereof is most desirably performed). Frequently, such adjustment of the nozzle/diffuser assembly requires frequent opening and re-pressurization of the vacuum chamber, so as to provide repeated access to the nozzle/diffuser assembly in order to facilitate adjustment of the position thereof.

As such, it is desirable to provide a means for adjusting the position of the nozzle/diffuser assembly with respect to the laser, ion, or electron beam which may be performed rapidly and simply and which does not require repeated opening and re-pressurization of the vacuum chamber.

Furthermore, it is desirable to provide a means for simultaneously moving a nozzle and diffuser (or a nozzle without diffuser) remotely, by computer control such that the output of extreme ultraviolet light can be optimized. The use of a computer controlled multi-stage positioner allows closed-loop controls to be used, and allows much faster and more accurate response than mechanical positioning systems.

SUMMARY OF THE INVENTION

The present invention specifically addresses and alleviates the above-mentioned deficiencies associated with the prior art. More particularly, the present invention comprises a method and apparatus for a lithographic light source support for adjustably supporting a nozzle/diffuser assembly in an integrated circuit fabrication lithography system. The lithography system comprises a vacuum chamber. The support comprises a XYZ micro-positioning stage configured to control positioning of the nozzle/diffuser assembly with respect to a radiated energy beam and optical components. The XYZ micro-positioning stage is configured to be controlled along three generally orthogonal axis from outside the vacuum chamber. An attached member attaches the XYZ micro-positioning stage to a surface within the vacuum chamber. The XYZ micro-positioning stage facilitates positioning of the nozzle/diffuser assembly at a desired location with respect to the beam of radiated energy so as to provide enhanced efficiency in the generation of light from the interaction of the radiated energy beam with gas flowing through the nozzle/diffuser assembly.

The micro-positioning stage preferably comprises an electrically actuated XYZ micro-positioning stage, and preferably further comprises at least one sensing device for sensing positioning of the nozzle/diffuser with respect to the beam of radiated energy, so as to facilitate closed loop positioning control of the XYZ micro-positioning stage with respect to the beam of radiated energy. The sensor may be a positional sensor or a light sensor sensitive to the wavelength or wavelengths of light desired, or a combination of both.

The attachment member is configured to attach the XYZ micro-positioning stage to an inside surface of a port cover of the vacuum chamber. Alternatively, the attachment member is configured to attach the XYZ micro-positioning stage to an inside wall of the vacuum chamber.

Thus, according to a preferred embodiment, the present invention comprises a vacuum chamber, a vacuum pump or pumps in fluid communication with the vacuum chamber for evacuating the vacuum chamber, and a nozzle/diffuser assembly disposed within the vacuum chamber. An XYZ micro-positioning stage is configured to control positioning of the nozzle/diffuser along three generally orthogonal axis and is configured to be controlled from outside of the vacuum chamber. The XYZ micro-positioning stage facilitates positioning of the nozzle/diffuser assembly at a desired location with respect to a beam of radiated energy. The source of radiated energy preferably comprises a plasma generated by either a laser light source, an electron beam source, or an ion beam source.

According to the methodology of the present invention, a pre-aligned nozzle/diffuser assembly of an integrated circuit fabrication lithography system is aligned by providing a nozzle/diffuser assembly wherein the nozzle and the diffuser are pre-aligned with respect to one another, attaching the nozzle/diffuser assembly to an XYZ micro-positioning stage which is attached to an inner-surface of the vacuum chamber, and sealing the nozzle/diffuser assembly within the vacuum chamber. The vacuum chamber is evacuated and a gas is caused to flow through the nozzle/diffuser assembly. A radiated energy beam is initiated within the vacuum chamber and the position of the nozzle/diffuser with respect to the radiated energy beam and optical components is adjusted so as to provide the desired generation of light from the interaction of the radiated energy beam with the flowing gas. Thus, according to the methodology of the present invention, a procedure is provided for facilitating quick and accurate adjustment of the nozzle/diffuser assembly with respect to the radiated energy beam. This procedure is particularly useful when the nozzle/diffuser assembly must be removed and replaced, such as during routine maintenance. One skilled in the art will also appreciate that the methodology of the present invention also facilitates rapid component removal and replacement, and easy access to all components subjected to wear or erosion.

These, as well as other advantages of the present invention will be more apparent from the following description and drawings. It is understood that changes in the specific structure shown and described may be made within the scope of the claims without departing from the spirit of the invention.

DETAILED DESCRIPTION OF THE PREFERRED EMBODIMENT

The detailed description set forth below in connection with the appended drawings is intended as description of the presently preferred embodiment of the invention and is not intended to represent the only form in which the present invention may be constructed or utilized. The description sets forth the functions and the sequence of steps for constructing and operating the invention in connection with the illustrated embodiment. It is to be understood, however, that the same or equivalent functions and sequences may be accomplished by different embodiments that are also intended to be encompassed within the spirit and scope of the invention.

Figure 1:
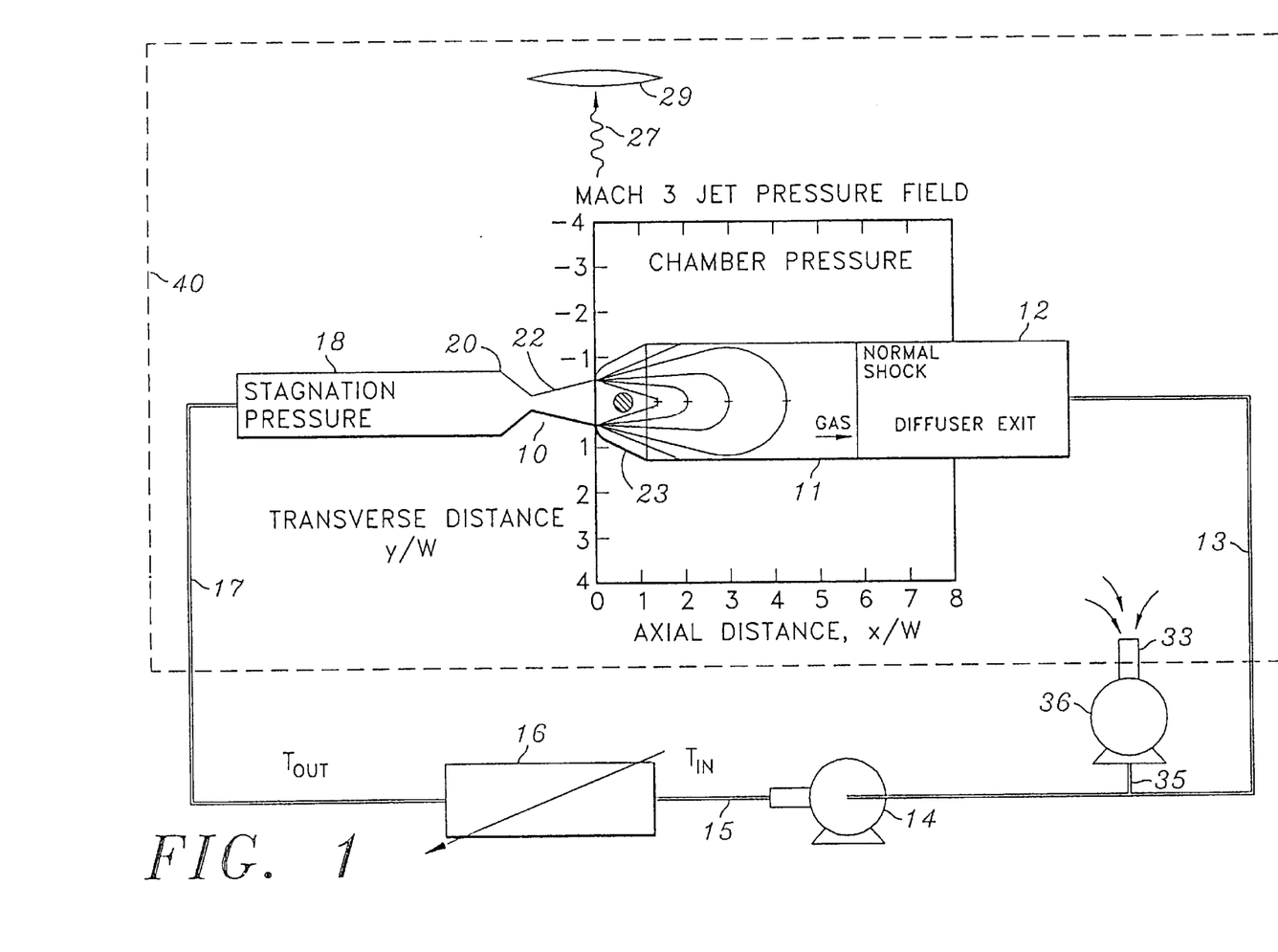
FIG. 1 is a schematic representation of the extreme ultra-violet photolithography gas jet target subsystem used to produce extreme ultraviolet light for facilitating the production of semi-conductor components having minimum feature sizes on the order of 100 nm and smaller, and showing a pressure profile for the flowing gas exiting the converging-diverging nozzle thereof.

The extreme ultra-violet photolithography system for facilitating production of semi-conductor components having geometries of 100 nm and smaller of the present invention is illustrated in FIGS. 1–14, which depict a presently preferred embodiment thereof. Referring now to FIG. 1, the extreme ultra-violet photolithography system generally comprises a miniature gas jet nozzle 10 from which gas 11 flows, at a supersonic velocity, toward diffuser 12 which captures a substantial portion of the flowing gas 11. The miniature gas jet nozzle 10 and the diffuser 12, as well as the collecting and focusing optics 29 and the work piece, i.e., integrated circuit chip(s) being fabricated, are all preferably disposed within a common vacuum chamber 40 or connected vacuum chambers so as to facilitate integrated circuit fabrication utilizing photolithography.

As described in detail below, the diffuser 12 reduces the velocity of the flowing gas 11, while simultaneously increasing the pressure thereof. Gas flows from the diffuser 12 via conduit 13 to compressor 14. The compressor 14 compresses, i.e., increases the pressure of, the gas 11 such that it may be recycled to the miniature gas jet nozzle 10 and thus used repeatedly to produce extreme ultra-violet light. Gas flows from the compressor 14 to heat exchanger 16 which is shown as a single unit. In practice, more than one heat exchanger may be necessary to assure steady and proper nozzle temperatures. Heat exchanger 16 is used for removing heat from the compressed gas.

According to the preferred embodiment of the present invention, the temperature of the gas entering the heat exchanger 16 is considerably higher than the temperature of the gas exiting the heat exchanger 16 which may be between 200° K and room temperature. The gas exiting the heat exchanger 16 is communicated via conduit 17 to the miniature gas jet nozzle 10 where a stagnation pressure of several atmospheres is developed. Stagnation pressure is defined herein as that gas pressure when no flow occurs.

Figure 2:
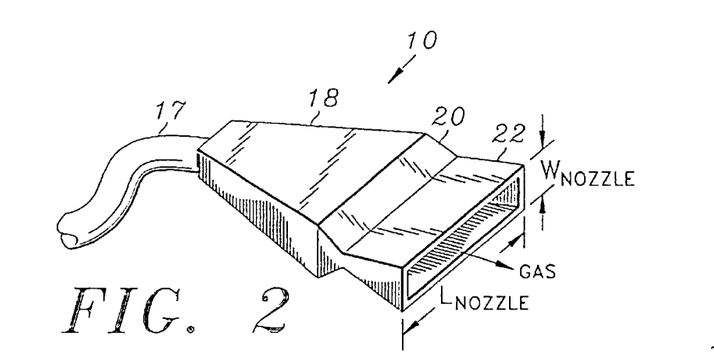
FIG. 2 is a perspective view of the converging-diverging nozzle of the present invention.

Referring now to FIG. 2 also, the miniature gas jet nozzle 10 more particularly comprises a pressure plenum 18 (or a straight approach section) into which the compressed gas flows. The miniature gas jet nozzle 10 can preferably further comprise a converging portion 20, and then a diverging portion 22. The miniature gas jet nozzle 10 is configured so as to accelerate the gas flowing therethrough to a supersonic velocity, preferably above Mach 2, preferably approximately Mach 3.

The diverging portion 22 preferably has a conical cross-section (but rectangular cross-sections also can be used) and is preferably configured such that the throat diameter (or width) is substantially smaller than the length of the diverging portion 22. Rectangular cross-section nozzles can be configured such that the length, Dimension L, is substantially greater than the width, Dimension W, thereof, or even configured with square cross section. These configurations provide high gas exit velocities which facilitate the exposure of a substantial portion of the flowing gas to the radiated energy beam with minimum gas absorption of extreme ultra-violet light produced by the interaction of the flowing gas exiting the nozzle with a laser, ion, or electron beam.

Figure 3:
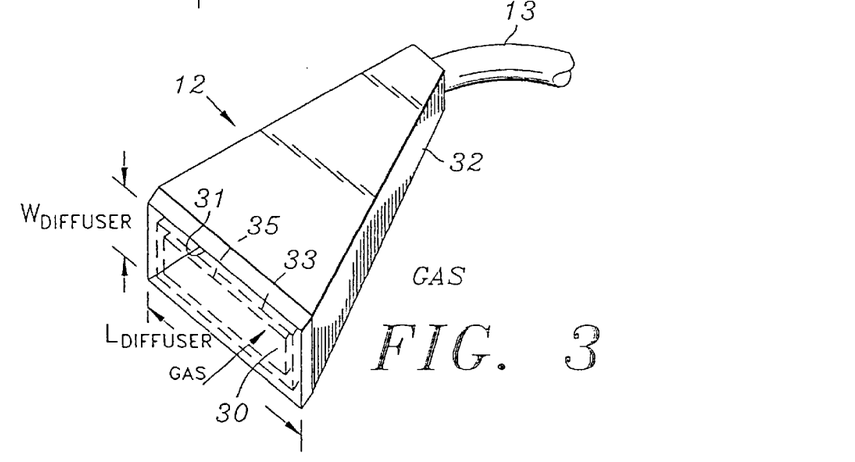
FIG. 3 is a perspective view of the diffuser of the present invention.

Referring now to FIGS. 1 and 3, the diffuser 12 generally comprises an opening which corresponds generally in size and configuration to that of the widest portion of the supersonic gas plume exiting from the miniature gas jet nozzle 10. Thus the opening of the diffuser has a diameter, or length and width which is preferably substantially larger than the outlet of the miniature gas jet nozzle 10 so as to capture a substantial portion of the gas flowing from the miniature gas jet nozzle 10. Those skilled in the art will appreciate that various different configurations of the diffuser 12 are suitable.

The outside entrance area of the diffuser 12 tapers conically from the opening 30 thereof to the outer surface which could obscure collection of extreme ultraviolet light. As discussed in detail below, the cross-sectional area on the inside of the diffuser 12 tapers linearly, increasing from the minimum near the entrance of the diffuser 12 smoothly or stepwise to the maximum inner diameter. Such tapering or stepwise changes in of the cross-sectional area of the diffuser 12 provides a gradual slowing and pressure recovery of the gasses captured thereby, while minimizing the occurrence of undesirable back-scatter or regurgitation which might otherwise occur.

When rectangular nozzles and diffusers are used, one or more knife edges can be formed in or proximate the diffuser 12 so as to aid in the deceleration of the gasses entering the opening 30. According to one embodiment of the present invention, the periphery of the opening 30 of the diffuser 12 is formed as a first knife edge 31. Additional concentric generally rectangular knife edges 33 and 35 are disposed within the opening 30 of the diffuser 12 and mounted thereto via any suitable means. Knife edge struts may optionally be utilized to mount the second 33 and third 35 concentric rectangular knife edges in place within the opening 30 of the diffuser 12. Those skilled in the art will appreciate that various different numbers and configurations of such knife edges may be utilized to effect generation of shocks which tend to decrease the velocity of the supersonic gas while simultaneously increasing the pressure thereof within the diffuser 12.

Isobaric pressure profiles of the gas flowing from the miniature gas jet nozzle 10 are provided in FIG. 1. The radiated energy beam, can be a laser, ion or electron beam. It is directed into that portion of the flowing gas 11 proximate the miniature gas jet nozzle 10, so as to enhance the efficiency of the present invention. This is better shown in FIG. 4 which illustrates the relative positions of the laser beam 23 and the flowing gas 11 in perspective.

Figure 4:
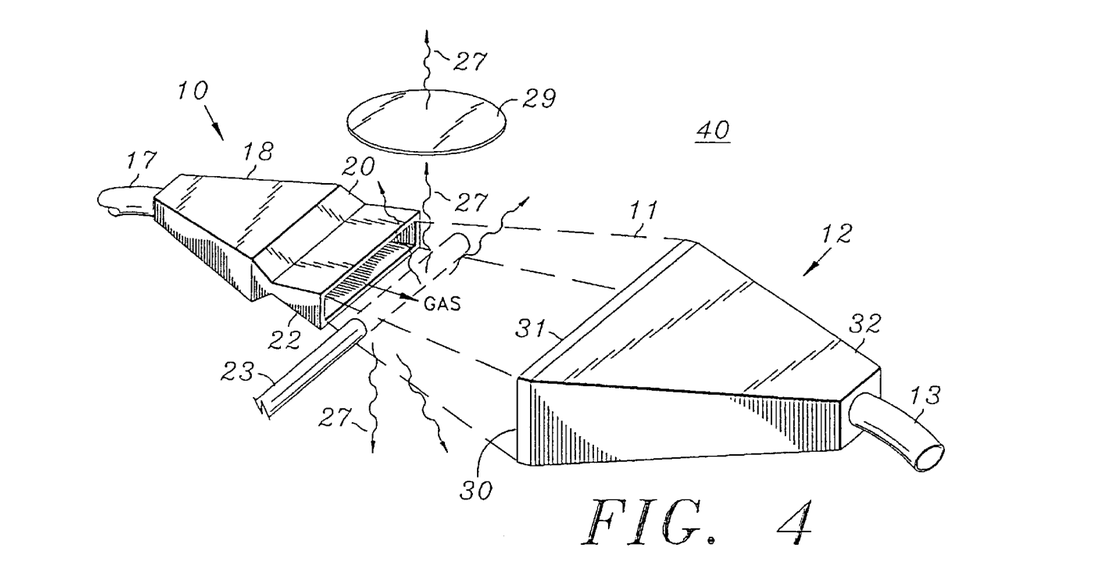
FIG. 4 is a perspective view showing gas flowing from the converging/diverging nozzle into the diffuser and also showing a radiated energy beam stimulating the emission of extreme ultra-violet light from the flowing gas, a portion of the extreme ultra-violet light being collected and focused by system optics.

A portion of the extreme ultra-violet light 27 whose emission is stimulated from the flowing gas 11 by the radiated energy beam 23 is collected and focused by collecting and focusing optics 29, which direct the extreme ultra-violet light onto a work piece, i.e., an integrated circuit component being fabricated, as desired. The focusing optics 29 are shown schematically only. The light collecting or focusing optics 29 can consist of a series of mirrors of various shapes which collect and transit the light to the work piece.

According to the preferred embodiment of the present invention, a vacuum pump (or pumps), preferably that vacuum pump 36 utilized to evacuate the vacuum chamber 40 within which the gas 11 flows and within which the photolithographic process is performed, evacuates a substantial portion of the gas 11 which is not captured by the diffuser 12 and provides that gas 11 back to the converging-diverging nozzle 10, preferably via the compressor 14 and heat exchanger 16, so as to facilitate recycling thereof.

Referring now to FIG. 4, in operation a gas, preferably a noble gas such as argon, helium, or xenon, or a combination thereof (including portions of other gases) flows at a supersonic velocity from the converging-diverging nozzle 18 when a pressurized supply thereof is provided and maintained to the converging-diverging nozzle 18 via gas conduit 17. Sufficient pressure is provided and maintained by compressor 14 to achieve the desired gas flow speed.

A radiated energy beam, preferably a laser beam, is directed through the supersonic gas flow 11 at a position which maximizes the transmission of the resulting extreme ultra-violet light through the gas 11, thereby mitigating undesirable absorption thereof.

A substantial portion of the flowing gas 11 is captured by the diffuser 12 and recycled. A substantial portion of the gas not captured by the diffuser 12 is evacuated from the vacuum chamber 40 via vacuum pump 36 and recycled.

At least a portion of the extreme ultra-violet light 27 emitted due to the interaction of the radiated energy beam 23 with the supersonic gas 11 is collected and focused by collecting and focusing optics 29 so as to facilitate photolithography therewith.

Thus, according to the present invention, contamination of the collecting and focusing optics 29, as well as any other sensitive surfaces within the vacuum chamber 40, is mitigated. Such contamination is mitigated since supersonic flow of the gas 11 tends to force most of the gas particles, i.e., molecules, atoms, ions, electrons, etc., into the diffuser 12, thereby substantially mitigating the amount of such particles floating freely within the vacuum chamber 40 and capable of coming into contact with such sensitive items.

The present invention takes advantage of the gas dynamic properties of the supersonic jet to direct any debris generated during the plasma formation into the diffuser, and thus away from the collection and focusing optics 29, as well as the rest of the photolithography system.

The efficiency of the present invention is enhanced by minimizing the amount of gas 11 through which the generated extreme ultra-violet light 27 must pass. As those skilled in the art will appreciate, extreme ultra-violet light is readily absorbed (and thus attenuated) by the noble gasses from which its emission is stimulated. Thus, it is very desirable to minimize the distance through which the extreme ultra-violet light 27 must travel through such gas. This is accomplished preferably by: focusing the radiated energy beam 23 close to the surface of the flowing gas 11, by positioning the radiated energy beam 23 proximate the discharge end of the miniature gas jet nozzle 10 where the gas flow has a comparatively narrow cross-sectional area and comparatively high density, and by collecting the extreme ultraviolet light emitted by the plasma over as large an angle as possible, including toward the radiated energy beam 23.

Thus, according to the present invention, the high density gas region should be confined to nearly the same volume as the plasma generated by the radiated energy beam. Thus, extreme ultra-violet light generated thereby is not required to travel through a substantial portion of the high density gas after leaving the area where stimulated emission occurs.

The high aspect ratio configuration of the miniature gas jet nozzle 10 tends to maximize the volume of flowing gas available for interaction with the radiated energy beam, while simultaneously minimizing the volume of flowing gas which attenuates the stimulated extreme ultra-violet light.

As those skilled in the art will appreciate, the higher the velocity of the flowing gas 11, the smaller the mass flow thereof which will diverge or turn away from the gas flow, i.e., jet, when surrounded by the very low pressure of the vacuum chamber. Any such flow which diverges from the gas jet into the high vacuum surrounding the gas jet must ultimately be pumped out against a very high adverse pressure ratio, which adds substantially to the cost of manufacturing and maintaining the system. Even more important, the gas that diverges from the gas jet becomes a potential contaminant for the collecting and focusing optics and also becomes an undesirable attenuating mass for the extreme ultra-violet light which is produced by the interaction of the radiated energy beam and the gas flow.

Further, by converting a significant portion of the kinetic energy of the flowing gas 11 into pressure, both the inlet pressure of the compressor 14 is increased, thereby necessitating a smaller pumping volume and therefore a smaller pump, and the $\Delta p$, that is the need to increase the pressure of the gas via the compressor 14, is reduced, thereby facilitating operation with a smaller capacity and less expensive compressor 14.

Figure 5:
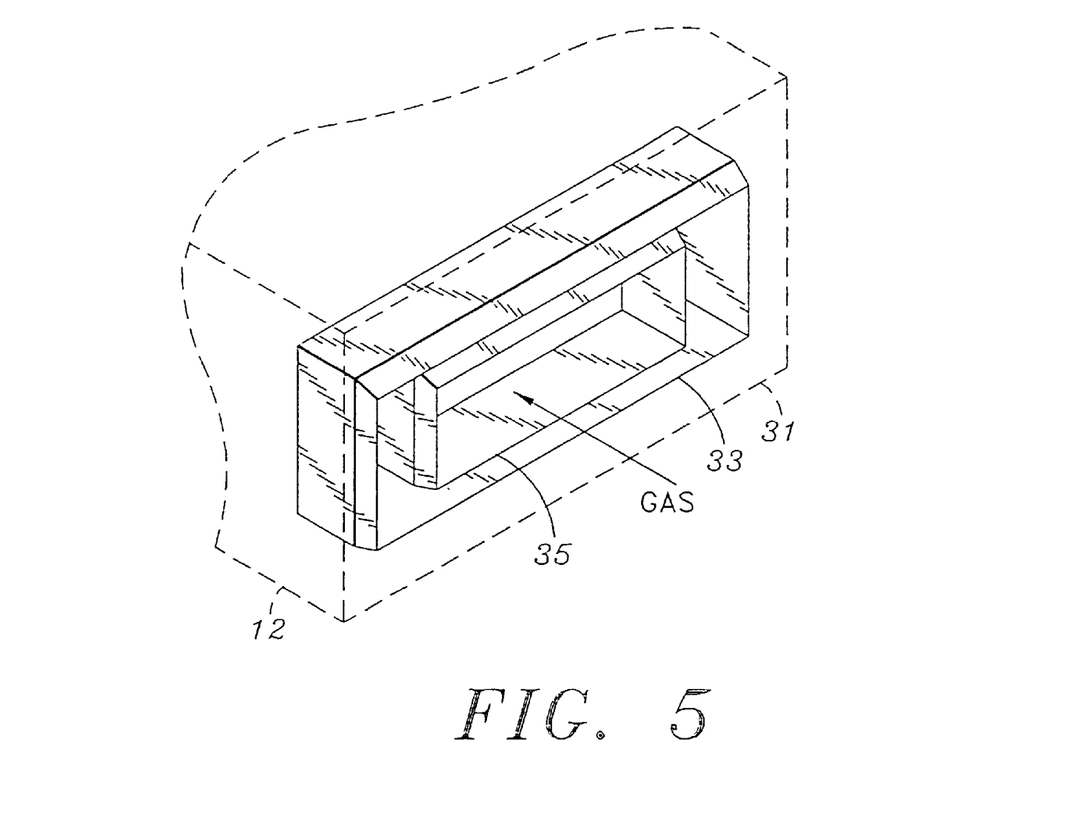
FIG. 5 is an enlarged view of a set of knife edges configured as concentric rectangular members for reducing the speed of the incoming gas while simultaneously increasing the pressure thereof.
Figure 6:
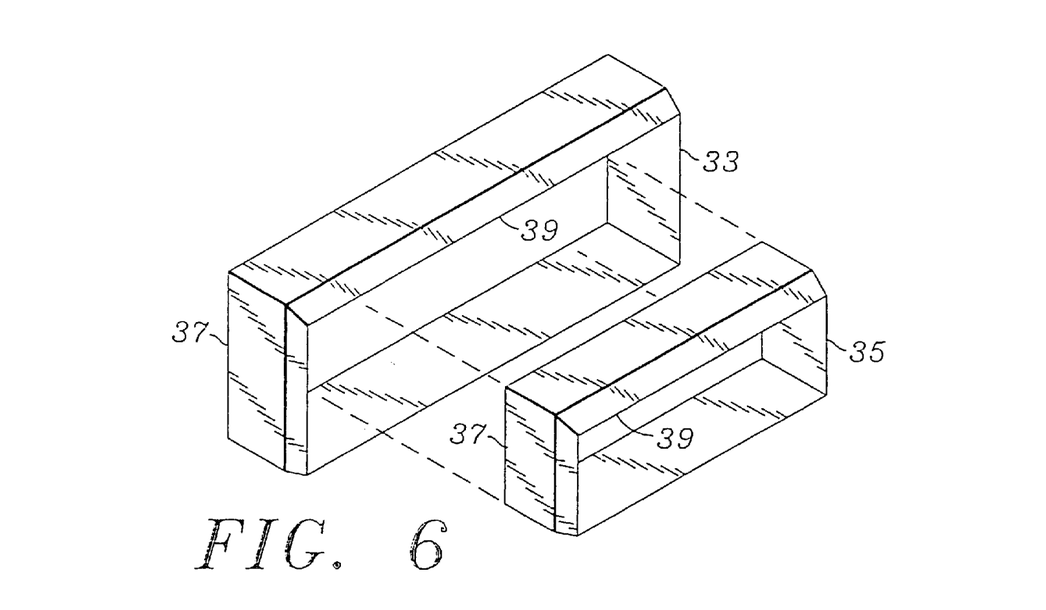
FIG. 6 is an exploded perspective view of the rectangular knife edges of FIG. 5.
Figure 7:
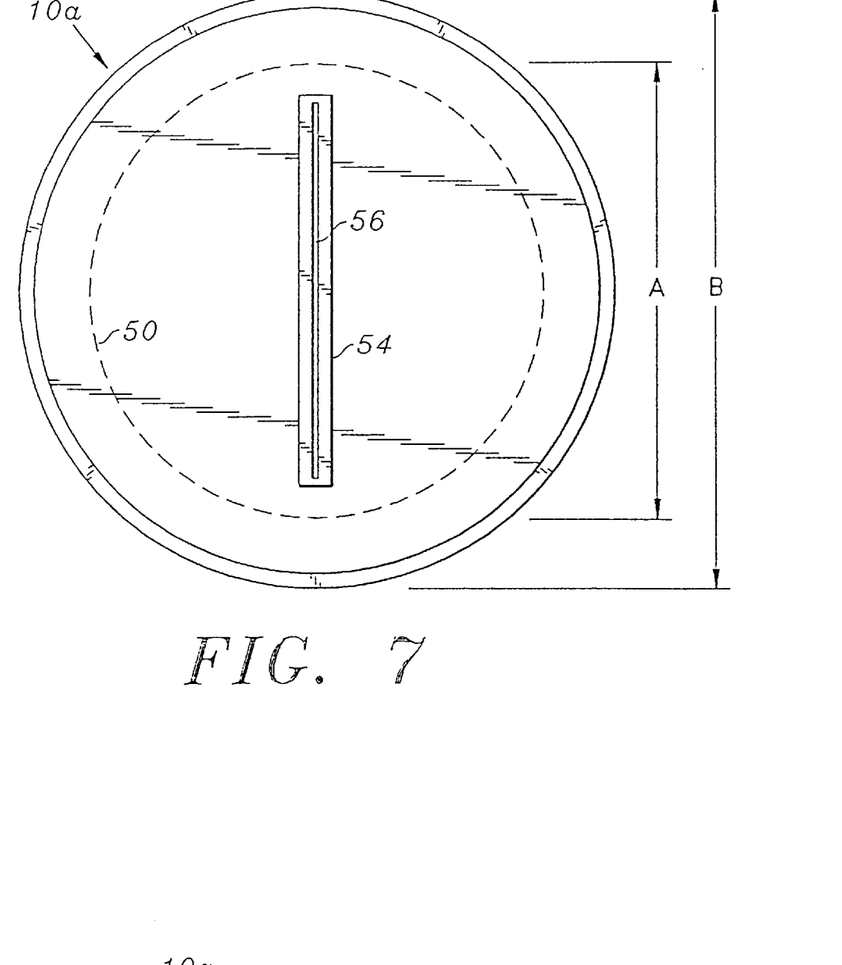
FIG. 7 is an end view of the converging-diverging nozzle which is configured as a flange or cap so as to easily attach to a continuous flow jet.

Referring now to FIGS. 5 and 6, the generally rectangular concentric knife edges 33, 35 of FIG. 3 are shown in further detail. Each generally concentric knife edge 33, 35 preferably comprises a body 37 and a bevel 39. As those skilled in the art will appreciate, it is the purpose of each knife edge 31, 33, and 35 to produce a shock wave, similar in nature to the sonic boom shock wave associated with supersonic aircraft, which defines a region of increased pressure within the diffuser 12, and thus facilitates reduction of the speed of the flowing gas 11 and simultaneously facilitates an increase in the pressure thereof.

Figure 8:
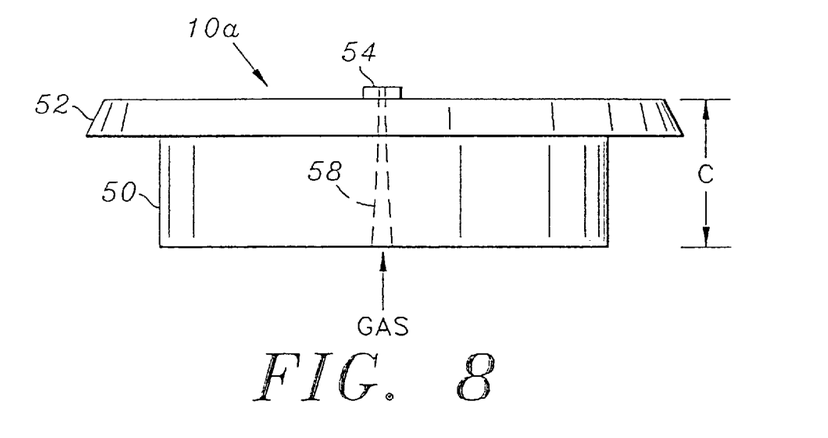
FIG. 8 is a side view of the converging-diverging nozzle of FIG. 7.

Referring now to FIG. 8, the converging-diverging nozzle is optionally configured as a cap 10a which can be specifically sized and shaped to fit a continuous flow jet. Thus, the cap 10a comprises a body 50 which can be sized to be received within the exit orifice of a continuous flow jet and a flange 52 which functions as a stop to limit insertion of the body 50 into the exit orifice. A rectangular boss 54 has a rectangular opening 56 formed therein. The converging-diverging bore 58 of the nozzle is formed in a continuous or co-extensive manner in the body 50, flange 52, and boss 54. Such construction facilitates easy removal and replacement of the converging-diverging nozzle 10a, particularly when a standard continuous flow jet is utilized.

Figure 9:
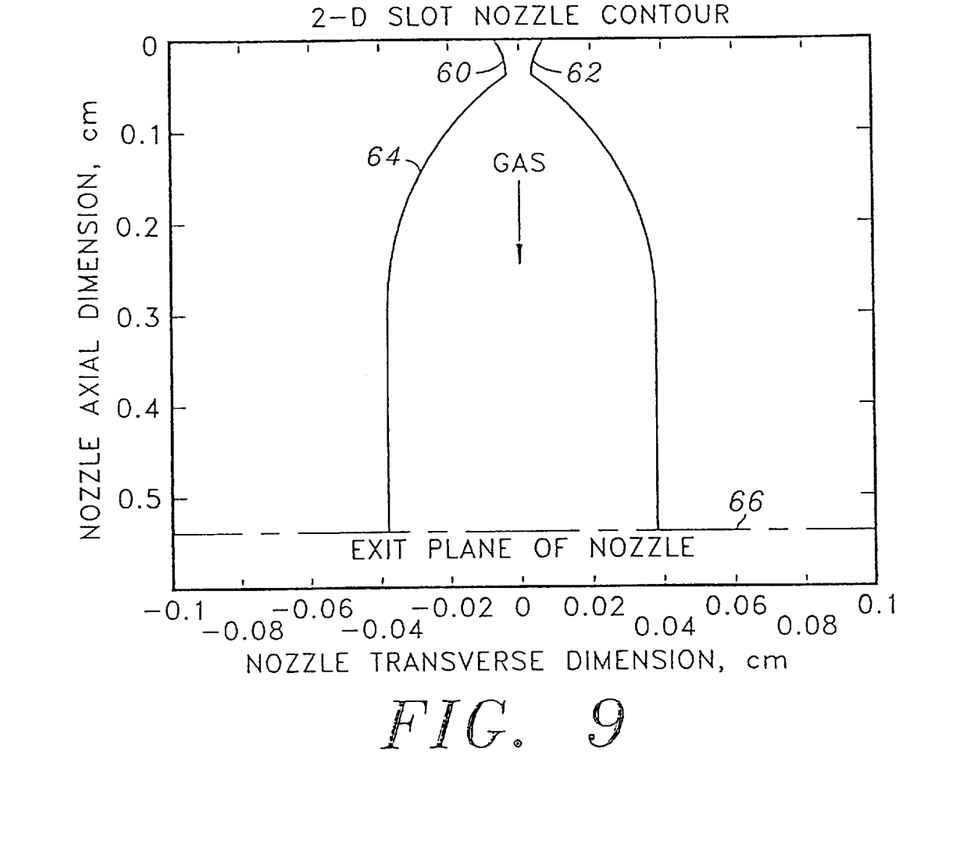
FIG. 9 is a detailed cross-sectional profile of the diverging portion of the converging-diverging nozzle.

Referring now to FIG. 9, a preferred cross-sectional profile of a nozzle orifice is shown. The nozzle comprises a converging region 60 which decreases to form a neck 62 and then increases in cross-sectional area to form the diverging region 64 thereof. The exit plane 66 is that plane of the nozzle flush with the end thereof, i.e., the outer opening thereof.

Figure 10:
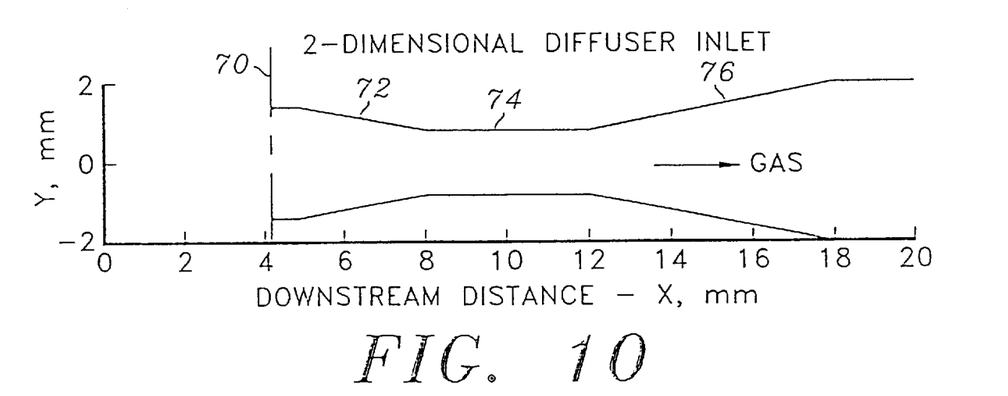
FIG. 10 is a detailed cross-sectional profile of the diffuser.

Referring now to FIG. 10, the cross-sectional profile of the diffuser is shown. According to one embodiment of the present invention, the diffuser tapers or converges from the entry plane 70 to define a converging portion 72 thereof. At the end of the converging portion 72 a neck 74 is formed and the diffuser may then optionally diverge or increase in cross-sectional area so as to form a diverging portion 76. As those skilled in the art will appreciate, the velocity of the flowing gas 11 decreases within the converging portion 72, while the pressure thereof simultaneously increases.

Figure 11:
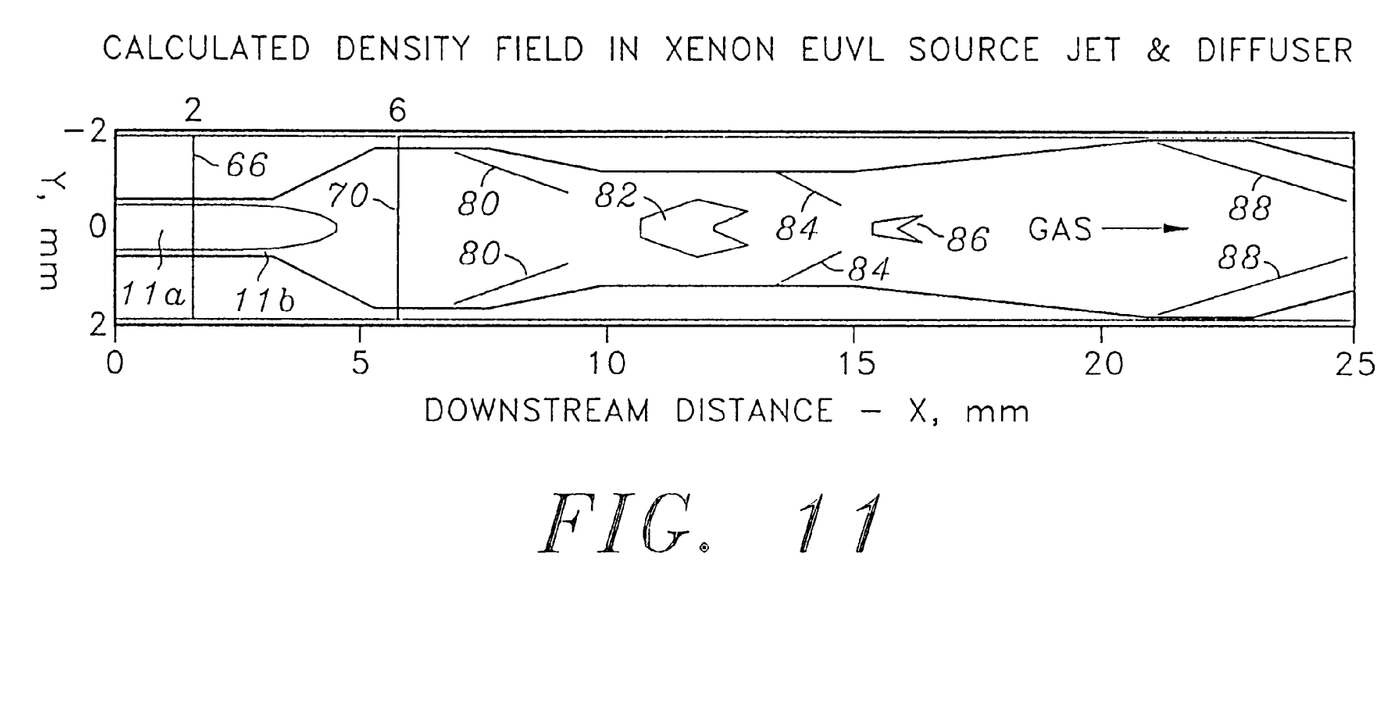
FIG. 11 shows the calculated density field of an extreme ultra-violet light source jet and diffuser using xenon gas and showing the shock resulting from the supersonic gas flow impinging upon the inner walls of the diffuser.

Referring now to FIG. 11, the calculated density field for a xenon extreme ultra-violet light source jet and diffuser is shown. Gas 11a from within the miniature gas jet nozzle 10 exits therefrom at the exit plane 66 to form gas jet 11b. The gas jet 11b enters the diffuser at the entry plane 70 thereof. Within the diffuser 12 first oblique shocks 80 are formed due to the knife edge(s) 31 defined by the opening 30 of the diffuser 12. The oblique shocks 80 interact to form perpendicular shock 82 downstream therefrom. Second oblique shocks 84 are formed as the flowing gas interacts with the internal walls of the diffuser. The second oblique shocks 84 interact with one another so as to form perpendicular shock 86. Third oblique shocks 88 are formed in a similar manner downstream from the second oblique shocks 84. As those skilled in the art will appreciate, each shock defines a high pressure region within which the flowing gas slows.

Figure 12:
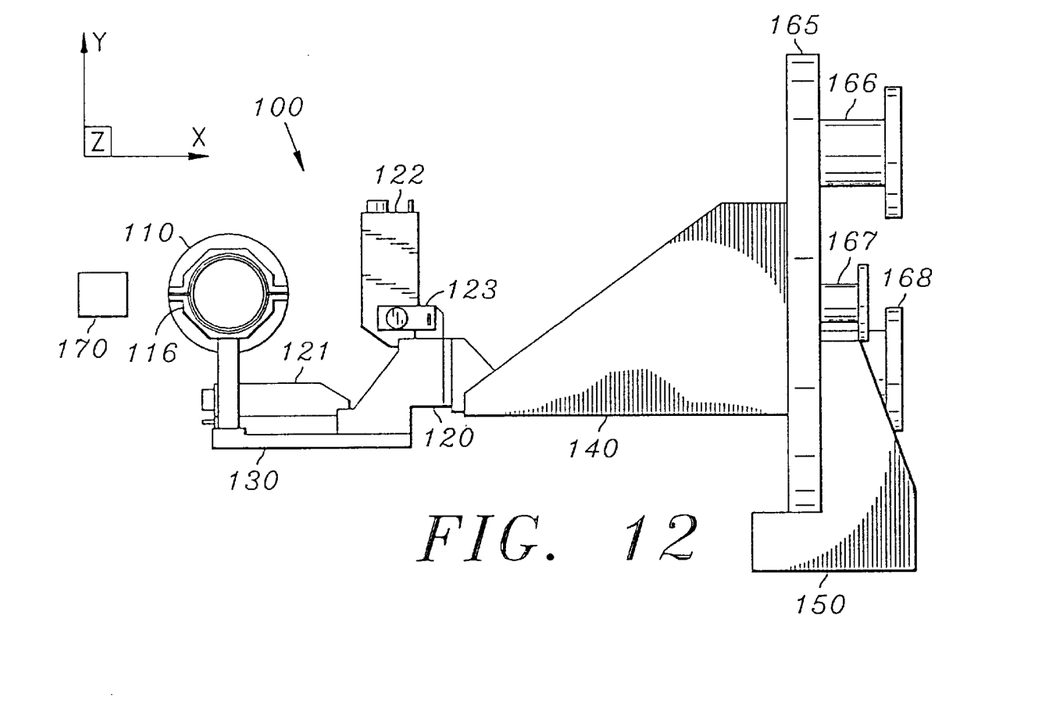
FIG. 12 is a side view of the apparatus for adjustably supporting a light source for use in photolithography of the present invention.
Figure 13:
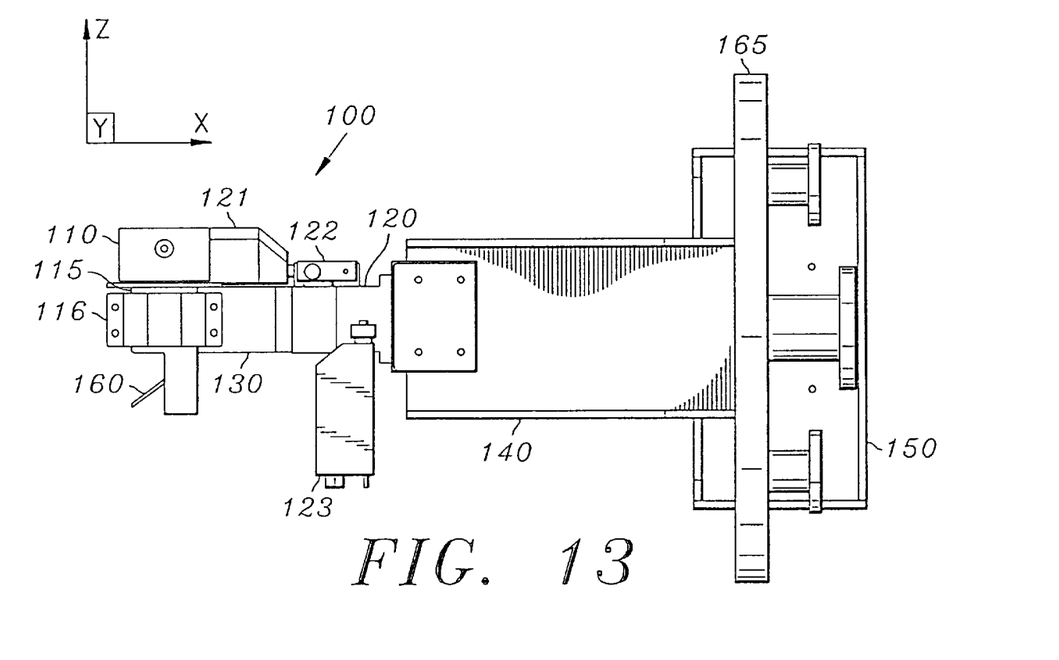
FIG. 13 is a top view of the apparatus of FIG. 12.
Figure 14:
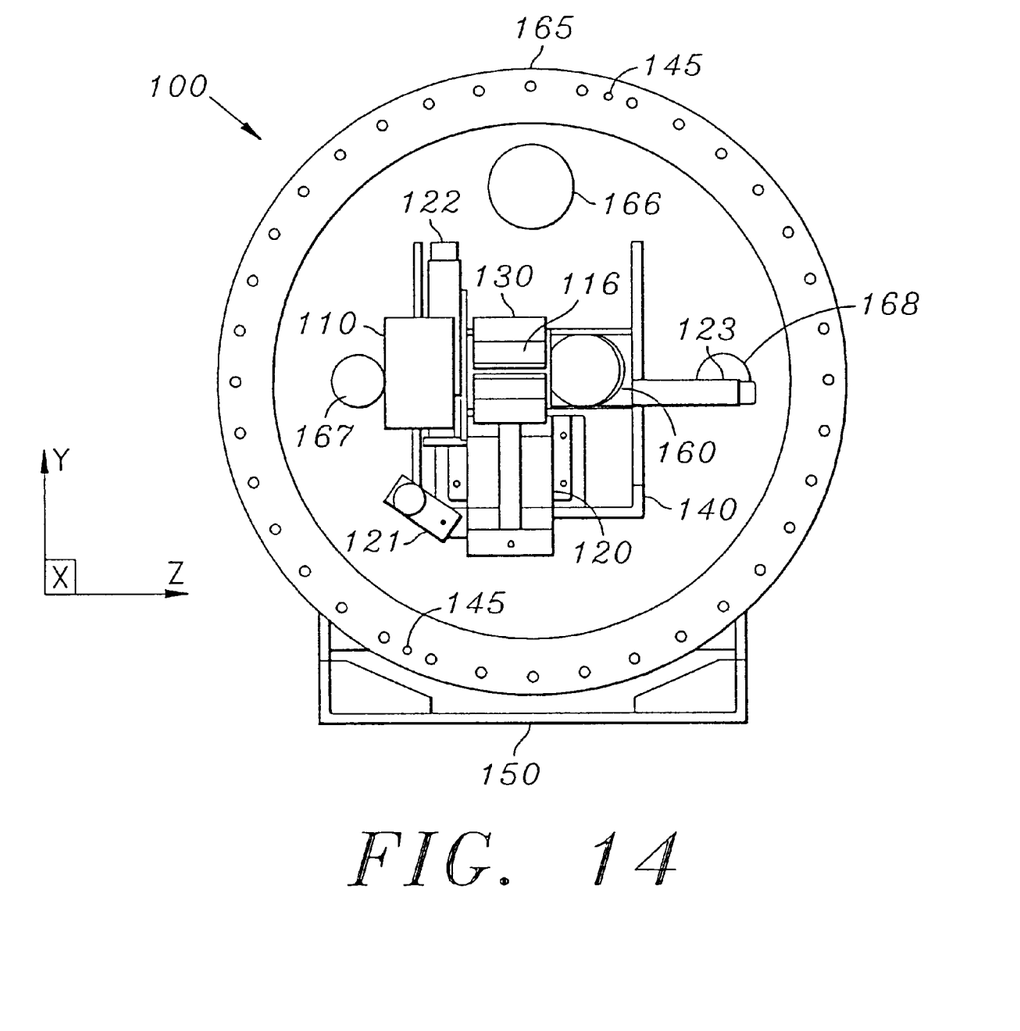
FIG. 14 is an end view of the apparatus of FIGS. 12 and 13.

Referring now to FIGS. 12–14, the present invention comprises a nozzle/diffuser holder assembly 110 disposed upon a pedestal mount assembly 130 which is moveable in the x direction via x actuator 121, moveable in the y direction via y actuator 122, and moveable in the z direction via the z actuator 123. The x, y, and z actuators 121, 122, and 123, effect positioning of XYZ micro-positioning stage 120 which is connected to attachment member 140 which defines a bracket which is attached either to an inside wall of the vacuum chamber or, is attached to an inside surface of an access port cover 165, as shown. The access port cover 165 optionally comprises additional access ports 166, 167, and 168. A holding fixture 150 provides mechanical support for the assembly when the access port cover 165 is removed from the vacuum chamber, so as to facilitate maintenance of the system.

Thus, according to the present invention, a nozzle/diffuser is attached to the nozzle/diffuser assembly 110 and its x, y, and z directions are adjusted via the x actuator 121, y actuator 122, and z actuator 123, respectively, after the access port cover 165 has been attached to the vacuum chamber and the vacuum chamber has been evacuated. Thus, the present invention facilitates remote accurate adjustment of the position of the nozzle/diffuser assembly during operation of the extreme ultra-violet light source and provides a means for facilitating a closed-loop positioning system when appropriate extreme ultraviolet sensor(s) 170 are added.

Thus, according to the present invention a pre-aligned miniature gas flow nozzle and diffuser can be rapidly mounted on a positioning stage with all of the desired degrees of freedom accurately controlled at minimal cost and with minimal extreme ultra-violet light obscuration. Pre-alignment of the nozzle and the diffuser is preferably performed off line, i.e., prior to mounting to the XYZ micro-positioning stage 120. However, as those skilled in the art will appreciate, the nozzle and the diffuser may be aligned with respect to one another after being mounted to the XYZ micro-positioning stage 120, if desired.

Since the nozzle and the diffuser are mounted on a pedestal 130 having a small cross sectional area, the potential for conductively transferring heat to the holder from the vacuum vessel, port cover, or positioning stage is minimized, while simultaneously minimizing the amount of light that is obscured.

Optionally, sensor 170 senses at least a portion of the extreme ultraviolet light generated by the plasma located at the center of the nozzle/diffuser assembly so as to facilitate alignment thereof. According to the preferred embodiment of the invention, a portion of the extreme ultraviolet light is sampled and closed loop control can be utilized to effect optimal positioning of the nozzle/diffuser assembly via the XYZ micro-positioning stage 120. The sensor 170 may consist of one or more sensors which can sample extreme ultraviolet light at several locations relative to the plasma source.

Connecting member 115 is retained by the pedestal mount assembly 130 such that the nozzle/diffuser holder assembly 100 can be rapidly removed and replaced. When attached, the nozzle/diffuser holder assembly 110 is positioned relative to an optic or beam steering element 160, such as a deflecting mirror. The laser, electron, or ion beam can therefore be deflected or focused as desired to a beam dump (not shown).

Preferably, indexing means such as tooling or dowel pins 145 and bushings, i.e., precision holes, are used as locating devices on the mating surfaces of the vacuum chamber flange to insure that the nozzle/diffuser holder assembly 110 returns to the same place after the vacuum chamber access port or cover 165 has been removed and replaced, thus maintaining desired alignment of the nozzle/diffuser assembly.

A holding fixture 150 or other similar means, e.g., a bracket or brackets and bearings can be used to attach the vacuum vessel to a set of rails, and should be utilized to hold the lithographic light sources support system 100 securely after removal, so as to facilitate maintenance or subcomponent replacement operation.

The pedestal mount assembly 130 is shown as a column on a support which retains the connecting member 115 by a clamshell-type clamp 116 or by direct connection to the steering element holder. The primary purpose of the pedestal mount 130 is to connect the XYZ micro-positioning stage 120 to the connecting member 115 using a narrow column, i.e., the pedestal mount assembly 130, which offers minimal obscuration to extreme ultraviolet light generated by the present invention. This pedestal mount assembly 130 can be vertical (as shown), horizontal, or mounted at any angle which offers no interference to extreme ultraviolet light collection or to other components. The pedestal mount assembly 130 is preferably made from Invar or other low-thermal expansion material.

It is understood that the exemplary method and apparatus for producing extreme ultra-violet light described herein and shown in the drawings represents only a presently preferred embodiment of the invention. Indeed, various modification and additions may be made to such embodiment without departing from the spirit and scope of the invention. For example, as those skilled in the art will appreciate, various different configurations of the x, y, and z actuators are likewise suitable. It is not necessary that the x, y, and z axis defined by these actuators conform to any other access of the system, although it may be desirable to do so. Further, it may be desirable to lock one or two of the actuators into position and utilize only the remaining actuator to effect desired adjustment, or to restrict the range of motion of any or all of the actuators. Further, although a nozzle/diffuser assembly is described in the specification and shown in the drawings it is contemplated that in some instances a diffuser will not be required. Thus, as defined herein, a nozzle/diffuser assembly is defined to include a nozzle assembly which lacks a diffuser. Thus, these and other modifications and additions may be obvious to those skilled in the art and may be implemented to adapt the present invention for use in a variety of different applications.

What is claimed is:

1. A lithographic light source support for adjustably supporting a nozzle/diffuser assembly in an integrated circuit fabrication lithography system, the lithography system comprising a vacuum chamber, the support comprising:
    a) a micro-positioning stage configured to control positioning of the nozzle/diffuser assembly with respect to a radiated energy beam, the micro-positioning stage being configured to be controlled along three generally orthogonal axes from outside of the vacuum chamber;
    b) an attachment member for attaching the micro-positioning stage to a surface within the vacuum chamber;
    c) wherein the micro-positioning stage facilitates positioning of the nozzle/diffuser assembly at a desired location with respect to the beam of radiated energy so as to provide enhanced efficiency in the generation of light from the interaction of the radiated energy beam with gas flowing through the nozzle/diffuser assembly.

2. The lithographic light source support as recited in claim 1 wherein the micro-positioning stage comprises an XYZ positioning stage.

3. The lithographic light source support as recited in claim 1, wherein the micro-positioning stage comprises an electrically actuated XYZ micro-positioning stage.

4. The lithographic light source support as recited in claim 3, wherein the attachment member is configured to attach the XYZ micro-positioning stage to an inside wall of the vacuum chamber.

5. The lithographic light source support as recited in claim 1, wherein the micro-positioning stage comprises an electrically actuated micro-positioning stage and further comprising at least one sensing device for sensing positioning of the nozzle/diffuser with respect to the beam of radiated energy, so as to facilitate closed loop positioning control of the micro-positioning stage with respect to the beam of radiated energy.

6. The lithographic light source support as recited in claim 1, wherein the attachment member is configured to attach the micro-positioning stage to an inside surface of a port cover of the vacuum chamber.

7. A system for providing a debris free radiation beam for use in lithographic processing of integrated circuits, the system comprising:
    a) a vacuum chamber;
    b) a vacuum pump in fluid communication with the vacuum chamber for evacuating the vacuum chamber;
    c) a nozzle/diffuser assembly disposed within the vacuum chamber;
    d) a source of radiated energy providing a radiated energy beam; and
    e) an XYZ micro-positioning stage configured to control positioning of the nozzle/diffuser along three generally orthogonal axes and configured to be controlled from outside of the vacuum chamber;
    f) wherein the XYZ micro-positioning stage facilitates positioning of the nozzle/diffuser assembly at a desired location with respect to a beam of radiated energy.

8. The system as recited in claim 7 wherein the source of radiated energy comprises a source selected from the list consisting of:
    a) a laser light source;
    b) an electron beam source; and
    c) an ion beam source.

9. A method for adjustably supporting a nozzle/diffuser assembly in an integrated circuit fabrication lithography system, the lithography system comprising a vacuum chamber, the method comprising the steps of:
    a) attaching a micro-positioning stage to a surface within the vacuum chamber; and
    b) controlling positioning of the nozzle/diffuser assembly with respect to a radiated energy beam via the micro-positioning stage, the micro-positioning stage configured to be controlled along three generally orthogonal axes from outside of the vacuum chamber;
    c) wherein the micro-positioning stage facilitates positioning of the nozzle/diffuser assembly at a desired location with respect to the beam of radiated energy so as to provide enhanced efficiency in the generation of light from the interaction of the radiated energy beam with gas flowing through the nozzle/diffuser assembly.

10. The method of claim 9, wherein the micro-positioning stage comprises an electrically actuated XYZ micro-positioning stage.

11. The method as recited in claim 10, wherein the step of controlling the position of the nozzle/diffuser comprises electrically actuating the XYZ micro-positioning stage and further comprising the step of sensing positioning of the nozzle/diffuser with respect to the beam of radiated energy, thus providing closed loop positioning control of the XYZ micro-positioning stage with respect to the beam of radiated energy.

12. The method as recited in claim 10, wherein the step of attaching the XYZ micro-positioning stage comprises attaching the XYZ micro-positioning stage to an inside surface of a port cover of the vacuum chamber.

13. The method as recited in claim 10, wherein the step of attaching the XYZ micro-positioning stage comprises attaching the XYZ micro-positioning stage to an inside wall of the vacuum chamber.

14. The method as recited in claim 9, wherein the step of controlling the position of the nozzle/diffuser assembly comprises electrically actuating at least one translator while simultaneously sensing the output of extreme ultraviolet light so as to provide closed loop positioning control and thus enhancing extreme ultraviolet light yield.

15. A method for aligning a nozzle/diffuser assembly of an integrated circuit fabrication lithography system, the method comprising the steps of:
    a) providing a nozzle/diffuser assembly wherein the nozzle and the diffuser are pre-aligned with respect to one another;
    b) attaching the nozzle/diffuser assembly to an XYZ micro-positioning stage, the XYZ micro-positioning stage being attached to an inner surface of a vacuum chamber;
    c) sealing the nozzle/diffuser assembly within the vacuum chamber;
    d) evacuating the vacuum chamber;
    e) flowing gas through the nozzle/diffuser assembly;
    f) initiating a radiated energy beam within the vacuum chamber; and
    g) adjusting the position of the nozzle/diffuser with respect to the radiated energy beam so as to provide enhanced efficiency in the generation of light from an interaction of the radiated energy beam with the flowing gas.

16. A semiconductor manufactured according to a process comprising the steps of:
- a) forming a photomask upon a substrate, the substrate having at least one of semiconductor, conductor, and insulator layers formed thereon, the step of forming a photomask comprising the steps of:
  - i) attaching a micro-positioning stage to a surface within a vacuum chamber;
  - ii) controlling position of a nozzle/diffuser with respect to a radiated energy beam via the micro-positioning stage, the micro-positioning stage configured to be controlled from outside the vacuum chamber;
  - iii) wherein the micro-positioning stage facilitates positioning of the nozzle/diffuser assembly at a desired location with respect to the beam of radiated energy so as to provide enhanced efficiency in the generation of light from the interaction of the radiated energy beam with gas flowing through the nozzle/diffuser assembly;
  - iv) using the light generated from the interaction of the radiated energy beam with gas flowing through the nozzle/diffuser assembly to cure the mask; and
- b) chemically etching at least one of the semiconductor, conductor, and insulator layers so as to form a desired pattern thereof.

* * * * *